US011171058B2

(12) United States Patent
Glass et al.

(10) Patent No.: US 11,171,058 B2
(45) Date of Patent: *Nov. 9, 2021

(54) SELF-ALIGNED 3-D EPITAXIAL STRUCTURES FOR MOS DEVICE FABRICATION

(71) Applicant: INTEL CORPORATION, Santa Clara, CA (US)

(72) Inventors: Glenn A. Glass, Portland, OR (US); Daniel B. Aubertine, North Plains, OR (US); Anand S. Murthy, Portland, OR (US); Gaurav Thareja, Hillsboro, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 290 days.

This patent is subject to a terminal disclaimer.

(21) Appl. No.: 15/668,288

(22) Filed: Aug. 3, 2017

(65) Prior Publication Data

US 2018/0019170 A1 Jan. 18, 2018

Related U.S. Application Data

(63) Continuation of application No. 13/560,513, filed on Jul. 27, 2012, now Pat. No. 9,728,464.

(51) Int. Cl.
*H01L 29/06* (2006.01)
*H01L 21/8238* (2006.01)
(Continued)

(52) U.S. Cl.
CPC .. *H01L 21/823807* (2013.01); *H01L 21/8258* (2013.01); *H01L 21/823814* (2013.01); *H01L 21/823821* (2013.01); *H01L 29/1054* (2013.01)

(58) Field of Classification Search
CPC ......... H01L 21/823807; H01L 21/8258; H01L 29/1054; H01L 21/823814; H01L 21/823821

See application file for complete search history.

(56) References Cited

U.S. PATENT DOCUMENTS 8,486,770 B1 7/2013 Wu et al.
8,497,171 B1 7/2013 Wu et al.
(Continued)

FOREIGN PATENT DOCUMENTS

CN 101779284 A 7/2010
CN 103187418 A 7/2013
(Continued)

OTHER PUBLICATIONS

People, R. and J.C. Bean, "Calculation of critical layer thickness versus lattice mismatch for GexSi1-x/Si strained-layer heterostructures", Appl. Phys. Lett., vol. 47, No. 3, Aug. 1, 1985. pp. 322-324. (Year: 1985).*

(Continued)

*Primary Examiner* — Khaja Ahmad
*Assistant Examiner* — Pavel G Ivanov
(74) *Attorney, Agent, or Firm* — Schwabe, Williamson & Wyatt P.C.

(57) ABSTRACT

Techniques are disclosed for customization of fin-based transistor devices to provide a diverse range of channel configurations and/or material systems within the same integrated circuit die. In accordance with one example embodiment, sacrificial fins are removed and replaced with custom semiconductor material of arbitrary composition and strain suitable for a given application. In one such case, each of a first set of the sacrificial fins is recessed or otherwise removed and replaced with a p-type material, and each of a second set of the sacrificial fins is recessed or otherwise (Continued)

removed and replaced with an n-type material. The p-type material can be completely independent of the process for the n-type material, and vice-versa. Numerous other circuit configurations and device variations are enabled using the techniques provided herein.

19 Claims, 9 Drawing Sheets

(51) Int. Cl.
*H01L 29/10* (2006.01)
*H01L 21/8258* (2006.01)

(56) References Cited

U.S. PATENT DOCUMENTS

| | | | |
|---|---|---|---|
| 8,497,177 | B1 | 7/2013 | Chang et al. |
| 9,165,837 | B1 | 10/2015 | Fronheiser et al. |
| 2004/0245579 | A1 | 12/2004 | Ohmi et al. |
| 2004/0262687 | A1 | 12/2004 | Jung et al. |
| 2005/0045819 | A1 | 3/2005 | Bedell et al. |
| 2005/0077553 | A1 | 4/2005 | Kim et al. |
| 2005/0145941 | A1 | 7/2005 | Bedell et al. |
| 2006/0085675 | A1* | 4/2006 | Popell ................ H04L 67/1095 714/6.12 |
| 2007/0034971 | A1 | 2/2007 | Anderson et al. |
| 2007/0105330 | A1 | 5/2007 | Enicks et al. |
| 2007/0122954 | A1 | 5/2007 | Liu et al. |
| 2007/0134864 | A1 | 6/2007 | Anderson et al. |
| 2008/0073667 | A1 | 3/2008 | Lochtefeld |
| 2008/0164491 | A1 | 7/2008 | Liu et al. |
| 2008/0169512 | A1 | 7/2008 | Doyle et al. |
| 2008/0224258 | A1 | 9/2008 | Schepis et al. |
| 2009/0057846 | A1 | 3/2009 | Doyle et al. |
| 2009/0065870 | A1 | 3/2009 | Li et al. |
| 2009/0072276 | A1 | 3/2009 | Inaba |
| 2009/0085027 | A1 | 4/2009 | Jin et al. |
| 2010/0038679 | A1* | 2/2010 | Chan ................ H01L 29/7848 257/190 |
| 2010/0163842 | A1 | 7/2010 | Lai et al. |
| 2010/0301390 | A1 | 12/2010 | Ko et al. |
| 2011/0068407 | A1 | 3/2011 | Yeh et al. |
| 2011/0084340 | A1 | 4/2011 | Yuan et al. |
| 2011/0097881 | A1 | 4/2011 | Vandervorst et al. |
| 2011/0147811 | A1 | 6/2011 | Kavalieros et al. |
| 2011/0147842 | A1 | 6/2011 | Cappellani et al. |
| 2011/0180847 | A1 | 7/2011 | Ikeda et al. |
| 2011/0241084 | A1 | 10/2011 | Wu et al. |
| 2012/0012932 | A1 | 1/2012 | Perng et al. |
| 2012/0091528 | A1 | 4/2012 | Chang et al. |
| 2012/0104472 | A1 | 5/2012 | Xu et al. |
| 2013/0032781 | A1 | 2/2013 | Miyoshi et al. |
| 2013/0161694 | A1 | 6/2013 | Adam et al. |
| 2013/0168771 | A1 | 7/2013 | Wu et al. |
| 2013/0196488 | A1* | 8/2013 | Hekmatshoartabari ................ H01L 21/02389 438/481 |
| 2013/0288480 | A1* | 10/2013 | Sanchez ............ H01L 21/02532 438/694 |
| 2014/0011341 | A1* | 1/2014 | Maszara ........... H01L 29/66795 438/478 |
| 2014/0027860 | A1 | 1/2014 | Glass et al. |
| 2014/0091360 | A1 | 4/2014 | Pillarisetty et al. |
| 2015/0024573 | A1 | 1/2015 | Jacob et al. |
| 2016/0190304 | A1 | 6/2016 | Morin et al. |

FOREIGN PATENT DOCUMENTS

| | | |
|---|---|---|
| EP | 2 315 239 A1 | 4/2011 |
| EP | 2 741 320 A1 | 11/2014 |
| JP | 2014063929 A | 4/2014 |
| KR | 20070022977 A | 2/2007 |

OTHER PUBLICATIONS

TW Office Action and Search Report received for TW Application No. 102125208, dated Mar. 9, 2015. 9 pages.
CN Office Action received for CN Application No. 201380033495.1, dated Aug. 3, 2016 . Total 18 pages (English translation 10 pages; original CN Office Action 8 pages).
International Search Report and Written Opinion received for PCT Application: PCT/US2014/043821, dated Mar. 26, 2015. 10 pages.
International Search Report and Written Opinion received for PCT Application No. PCT/US2013/045471, dated Aug. 26, 2013. 9 pages.
Extended European Search Report for EP Application No. 13822511.5, dated Feb. 2, 2016, 10 pages.
People, R. and J.C. Bean, "Calculation of critical layer thickness versus lattic mismatch for Gex Si1-x/Si strained-layer heterostructures," Appl Phys Lett., vol. 47, No. 3, Aug. 1, 1985 pp. 322-324.
Akarvardar, I. OK, K., et al., "Strained SiGe and Si FinFETs for High Performance Logic with SiGe/Si stack on SOI," IEEE, 2010 International Electron Devices Meeting pp. 34.2.1-34.2.4.
Kim, et al., "Increased critical thickness for high Ge-content strained SiGe-on-Si using selective epitaxial growth," American Institute of Physics, Appl. Phys. Lett. 97, 262106 (2010). Dec. 28, 2010. 4 pages.
Oura, et al., "Surface Science—An Introduction," Springer-Verlag Berlin Heidelberg, 2003. 7 pages.
Notice of Preliminary Rejection received for KR Application No. 10-2016-7030458 dated Sep. 11, 2018. 7 pages.

\* cited by examiner

SELF-ALIGNED 3-D EPITAXIAL STRUCTURES FOR MOS DEVICE FABRICATION

RELATED APPLICATION

The present application is a continuation of U.S. patent application Ser. No. 13/560,513, filed on Jul. 27, 2012, now U.S. Pat. No. 9,728,464, which is herein incorporated by reference in its entirety.

BACKGROUND

Maintaining mobility improvement and short channel control as microelectronic device dimensions continue scale provides a challenge in device fabrication. Fin-based transistor devices can be used to provide improved short channel control. For example, silicon germanium ($Si_xGe_{1-x}$, where x<0.2) fin-based channel structures provide mobility enhancement, which is suitable for use in many conventional products.

BRIEF DESCRIPTION OF THE DRAWINGS

As will be appreciated, the figures are not necessarily drawn to scale or intended to limit the claimed invention to the specific configurations shown. For instance, while some figures generally indicate straight lines, right angles, and smooth surfaces, an actual implementation of an integrated circuit structure may have less than perfect straight lines, right angles, and some features may have surface topology or otherwise be non-smooth, given real world limitations of the processing equipment and techniques used. In short, the figures are provided merely to show example structures.

DETAILED DESCRIPTION

Techniques are disclosed for customization of fin-based transistor devices to provide a diverse range of channel configurations and/or material systems, and within the same integrated circuit die. In accordance with an embodiment of the present invention, sacrificial fins are removed and replaced with custom semiconductor material of arbitrary composition and strain suitable for a given application. In one such embodiment, each of a first set of the sacrificial fins is recessed or otherwise removed and replaced with a p-type layer material, and each of a second set of the sacrificial fins is recessed or otherwise removed and replaced with an n-type layer material. The p-type layer material can be completely independent of the process for the n-type layer material, and vice-versa. Another embodiment may include a combination of original fins and replacement fins. Another embodiment may include replacement fins all of the same configuration. Numerous other circuit configurations and device variations are enabled using the techniques provided herein.

General Overview

A metal oxide semiconductor (MOS) transistor's internal resistance is generally dictated by dimension and material properties. A standard material for a MOS transistor channel is silicon. While silicon has many good attributes, it may not always be suitable, particularly when there is a desire to create transistors with higher carrier mobility than that possible in silicon. Nor is silicon suitable when there is a desire to have the flexibility of different channel materials in p-type MOS (PMOS) and n-type MOS (NMOS) regions, and particularly when there is a desire for these different channel materials to be defect free and deposited on a thin (e.g., <200 Å) or no buffer layer. One approach to replace silicon with other materials involves depositing a planar film overlayer on a silicon substrate and then proceeding with shallow trench recess processing. Unfortunately, this approach severely limits integration of dissimilar materials for PMOS and NMOS regions. Furthermore, assuming a planar film of silicon germanium over silicon for example, the maximum germanium concentration of strained (defect free) material is limited to near 40% for planar pseudomorphic films fabricated with standard deposition techniques at typical required thickness of 100 nm. Such a limitation would not be suitable given, for instance, a desire to enable significantly higher germanium concentrations and avoid exotic precursor materials.

Thus, in accordance with an embodiment of the present invention, an initial structure is provided with patterned sacrificial fins in a shallow trench isolation matrix. After trench isolation processing, the sacrificial fins (or subset of the fins) are removed and replaced with epitaxial material of arbitrary composition and strain suitable for a given application. In one such embodiment, each of a first set of the sacrificial fins is recessed or otherwise removed and replaced with a p-type layer material, and each of a second set of the sacrificial fins is recessed or otherwise removed and replaced with an n-type layer material. As will be appreciated in light of this disclosure, the p-type layer material can be completely independent of the process for the n-type layer material, and vice-versa. In another embodiment, a combination of original fins and replacement fins are provisioned. In another embodiment, replacement fins all of the same configuration are provisioned. The polarity, composition, and strain of the various provisioned fins can be configured to any desired scheme.

In some embodiments, replacement fins can be an epitaxial growth of, for example, silicon germanium (SiGe) alloy of arbitrary composition, germanium, germanium-tin alloy of arbitrary composition, III-V material of arbitrary composition, or any other semiconductor material, alloy or compound suitable for a given application or otherwise desired. Any suitable epitaxial deposition techniques such as chemical vapor deposition (CVD), rapid thermal CVD (RT-CVD), gas-source molecular beam epitaxy (GS-MBE), etc can be used to provide the replacement fin material, and numerous suitable semiconductor materials and alloys thereof (e.g., column IV material, column III-V materials, etc) can be used, as will be appreciated in light of this disclosure.

In some embodiments, the recess and replacement techniques provided herein can be used, for example, to fabricate fin-based transistors such as field effect transistors (FinFETs), and are particularly well-suited for forming tri-gate transistor architecture where the diffusion lines can be much narrower than the equivalent process node for planar transistors. In some embodiments, for example, a diffusion width of less than 50 nm, or less than 40 nm, or less than 30 nm is provided. In addition, in some embodiments, epitaxial materials such as SiGe alloys (or other suitable semiconductor materials categories) may be defect free as-deposited in these relatively narrow structures. In this case, the shape of the deposition has no trapping effect on crystalline defects because the the deposited material is intentionally free of such defects as dislocations and grain boundaries.

In one specific example embodiment, the disclosed techniques can be used to fabricate fully strained silicon germanium (SiGe) fin-based PMOS transistors that are compatible with hybrid channel MOS. Numerous other circuit configurations and device variations are enabled using the techniques provided herein, as will be appreciated in light of this disclosure. For instance, various fin dimensions can be tuned to provide a desired effect (e.g., transistor density, channel strain, current density, etc). In another embodiment, a circuit configuration may include multiple types of NMOS and/or PMOS transistors on the same die. Another embodiment may be configured with custom channel layer dimensions and/or composition within the circuit die (e.g., with suitable masking or selective deposition). Another embodiment may be configured with different fins and/or material layers. For instance, one such embodiment may be configured with original substrate-based fins for one device type, and replacement fins for another device type. One specific example circuit may be configured with silicon or $Si_xGe_{1-x}$ original fins where x=0.25, as well as replacement fins of $Si_xGe_{1-x}$ where x=0.4. Another example circuit may be configured with column IV material original fins and III-V material replacement fins. Another example circuit may be configured with III-V material original fins and column IV material replacement fins. Another example circuit may be configured with III-V material replacement fins and column IV material replacement fins. Another example circuit may be configured with gallium arsenide fins for NMOS as well as SiGe fins for PMOS, at least one of which is a replacement fin as variously described herein. Diversity with respect to device polarity and/or channel composition is effectively unlimited when employing the various techniques provided herein.

Figure 7:
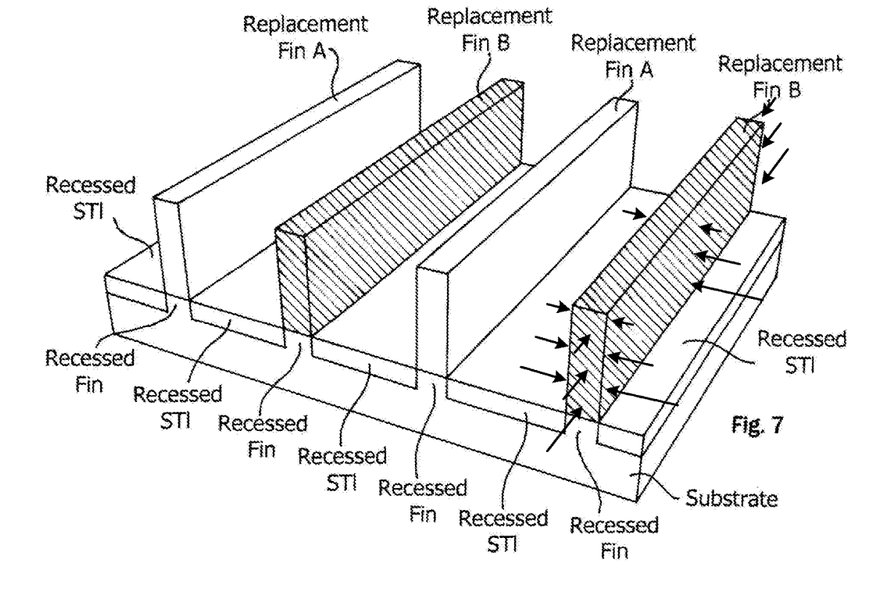

As will be appreciated in light of this disclosure, the original sacrificial fin (diffusion) material acts as a template or placeholder to facilitate subsequent customization of the diffusion region, in accordance with an embodiment. In some cases, the quality of the epitaxial material grown in the void area above the recessed or otherwise short fin depends on the geometry of the recess/void as well as the lattice mismatch and surface energies of the two materials (the STI material and the replacement fin material). For long and narrow lines, films are capable of growing epitaxially and with much lower crystalline defect densities than possible with large area planar growth. Epitaxial film growth proceeds to fill the recess and slightly higher. In some embodiments, post film growth polish processing can be used to trim any excess epitaxial film flat with the surrounding STI material or as otherwise desired. Lithographic masking can independently define diverse die regions with respect to polarity (e.g., PMOS and NMOS, or different PMOS types, or different NMOS types, etc), strain (e.g., compressive strain for PMOS tensile strain for NMOS), and composition such that any set of materials can be used in combination, in accordance with some embodiments. FIG. 7 includes vectors on Replacement Fin B to illustrate an example of compressive strain.

Thus, such techniques as provided herein enable significant customization of transistor channels to provide a diverse range of configurations and/or material systems. A scanning electron microscopy (SEM) or transmission electron microscopy (TEM) cross-section perpendicular to gate lines or fins can be used to show the custom channels in non-planar transistor structures, in accordance with some embodiments of the present invention. For instance, in some such embodiments, the SEM/TEM cross-section will show p-type channels having a first configuration, and n-type channels having a second configuration that is different from the first.

Methodology and Architecture

FIGS. 1 through 8 illustrate a process for forming fin-based transistor devices, as well as various example resulting structures, in accordance with an embodiment of the present invention. As can be seen, this example process employs a recess and replace technique in forming the channel material, which in turn yields structures that are distinct from structures formed from a pre-fabricated two-dimensional planar material that is patterned into fins. For instance, structures implemented in accordance with an embodiment of the present invention may exhibit diverse channel materials and/or configurations, which are formed in the context of a self-aligning process by virtue of the recess provided upon removal of the sacrificial fin material.

Figure 1:
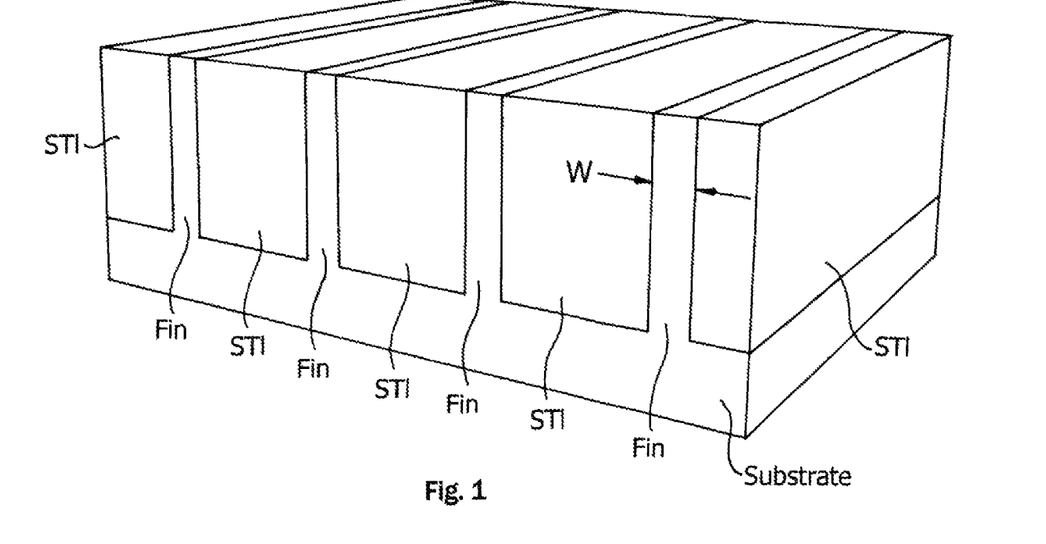
FIGS. 1 through 8 illustrate a process for forming fin-based transistor devices, as well as various example resulting structures, in accordance with an embodiment of the present invention. Inset 8' is a blown-out portion of FIG. 8, illustrating replacement fins that do not share a common horizontal plane, in accordance with an embodiment.

FIG. 1 illustrates a structure resulting from the patterning of sacrificial fins and a shallow trench isolation (STI) process. As can be seen, a substrate is provided. The substrate can be, for example, a blank substrate that is to be prepared for subsequent semiconductor processes by forming a number of sacrificial fin structures therein. Alternatively, the substrate can be a partially formed semiconductor structure upon which sacrificial fin structures are preformed. Still in other embodiments, the substrate can be a partially formed semiconductor structure upon which sacrificial fin structures were formed and, after an STI process, were subsequently recessed or otherwise removed to provide fin recesses. Thus, the substrate may come blank, or with preformed fins, or with preformed fins and STI, or with preformed STI and fin recesses. In one such example embodiment, the substrate comes with preformed fins and STI, wherein the top of some of the fins is flush with the top surface of the STI, and the top of at least some of the other fins is below the top surface of the STI such that they are pre-recessed or otherwise fabricated to be shorter than the fins flush with the STI. In this sense, note that the act of fin recessing is not necessarily required, so long as fins are provided having a top that is below the STI.

Any number of suitable substrate configurations can be used here, including bulk substrates, semiconductors on insulator substrates (XOI, where X is a semiconductor material such as Si, Ge or Ge-enriched Si), and multi-layered structures. In a more general sense, any substrate upon which sacrificial fins can be formed prior to a subsequent transistor formation process can be used. In one specific example case, the substrate is a silicon bulk substrate. In other implementations, the semiconductor substrate may be formed using alternate materials, which may or may not be combined with silicon, that include but are not limited to germanium, indium antimonide, lead telluride, indium arsenide, indium phosphide, gallium arsenide, or gallium antimonide. Further semiconductor materials classified as group III-V or group IV materials may also be used to form the substrate. Although a few examples of materials from which the substrate may be formed are described here, any material that may serve as a foundation upon which a semiconductor device may be built falls within the spirit and scope of the claimed invention.

The sacrificial fins can be formed using any number of suitable processes. Some embodiments may employ, for example, the deposition and patterning of a hardmask on the substrate. This can be carried out using standard photolithography, including deposition of one or more hardmask materials (e.g., such as silicon dioxide, silicon nitride, and/or other suitable hardmask materials), patterning resist on a portion of the hardmask that will remain temporarily to protect an underlying region of the fin (such as a diffusion or active area of a transistor device), etching to remove the unmasked (no resist) portions of the hardmask (e.g., using a dry etch, or other suitable hardmask removal process), and then stripping the patterned resist material, thereby leaving the patterned mask. In some such embodiments, the resulting hardmask is a two-layer hardmask configured with a bottom layer of oxide (e.g., native oxide, such as silicon dioxide resulting from oxidation of silicon substrate) and top layer of silicon nitride. Any number of suitable mask configurations can be used in forming the sacrificial fins, as will be apparent. While the illustrated embodiment shows fins as having a width W that does not vary with distance from the substrate, the fin may be narrower at the top than the bottom in another embodiment, wider at the top than the bottom in another embodiment, or having any other width variations and degrees of uniformity (or non-uniformity). Further note that the width variation may, in some embodiments, be symmetrical or asymmetrical. Also, while the fins are illustrated as all having the same width W, some fins may be wider and/or otherwise shaped differently than others. For example, in an embodiment, fins to be used in the creation of NMOS transistors may be narrower than fins to be used in the creation of PMOS transistors. Other arrangements are possible, as will be appreciated. In some embodiments, for example, the fin width W, which defines the width of the diffusion area of a fin-based transistor device can be less than 50 nm, or less than 40 nm, or less than 30 nm. In a more general sense, the fins can be patterned to have widths W that are much more narrow relative to, for instance, planar transistor technologies.

As can be further seen in FIG. 1, shallow trenches are provisioned in the substrate and subsequently filled with an insulating material so as to provide shallow trench isolation (STI) about a plurality of fins, in accordance with an embodiment of the present invention. Any number of fins can be provided, and in any desired pattern or configuration suitable for a given application. The shallow trench etch can be accomplished, for example, with standard photolithography including wet or dry etching, or a combination of etches if so desired. The geometry of the trenches (width, depth, shape, etc) can vary from one embodiment to the next as will be appreciated, and the claimed invention is not intended to be limited to any particular trench geometry. In one specific example embodiment having a bulk silicon substrate and a two-layer hardmask implemented with a bottom silicon dioxide ($SiO_2$) layer and a top silicon nitride layer, a dry etch is used to form the trenches that are about, for instance, 100 Å to 5000 Å below the top surface of the substrate. Any number of trench configurations can be used depending on the desired fin height, as will be apparent. The trenches can be subsequently filled using any number of suitable deposition processes. In one specific example embodiment having a silicon substrate, the insulating STI fill material is $SiO_2$, but any number of suitable isolation dielectric materials can be used to form the shallow trench isolation (STI) structures here. In general, the deposited or otherwise grown isolation dielectric material for filling the trenches can be selected, for example, based on compatibility with the native oxide of the substrate material. Note that the STI trenches may be circular or polygonal in nature, and any reference to trench 'sides' is intended to refer to any such configurations, and should not be interpreted to imply a particular geometric shaped structure. FIG. 1 further demonstrates how the STI insulation material can be planarized using, for example, chemical mechanical planarization (CMP) or other suitable process capable of planarizing the structure. In the example embodiment shown, the mask over the sacrificial fins is completely removed. Other embodiments may utilize a selective planarization configured to leave a portion of the mask in place, which can be used in subsequent processing, such as shown in FIG. 2.

Figure 2:
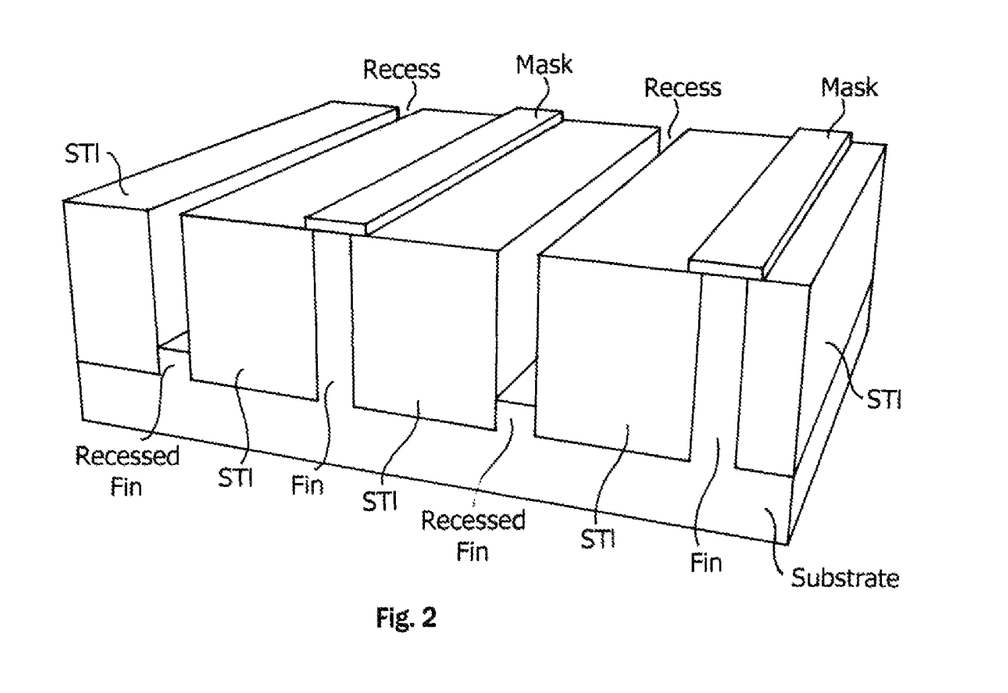

FIG. 2 illustrates a process and resulting structure wherein some of the fins are masked and others are recessed, in accordance with an embodiment of the present invention. In this example case, there are four fins shown, with two being masked and two being recessed, in an alternating manner (e.g., recessed, masked, recessed, masked). The mask can be, for example, provisioned anew or left over from the STI process as previously described. In any case, the mask can be any suitable material that will withstand the recess etch of the unmasked fins and subsequent processing to fill those recesses (such as epitaxial processing). Any suitable etch process can be used (e.g., wet and/or dry etch with masking and/or etch selectivity). In one example embodiment, the recess etch is a selective etch that will remove the unmasked fin material but not the STI or mask materials. In such a case, note that the mask material may also be implemented with the STI material (e.g., silicon dioxide) or any other material resistant to the fin recess etch (e.g., silicon nitride). In one specific example embodiment, the sacrificial fins are silicon and the mask is silicon dioxide and/or silicon nitride, and the recess etch is carried out using a wet etch (e.g., potassium hydroxide or other suitable etchant that will remove the unmasked silicon fin material but not the STI material). The depth of the sacrificial fin etch can vary from one embodiment to the next, and may leave a pedestal (as shown in FIG. 2), or a recess into the substrate past the original fin bottom (effectively, the mirror image of a pedestal across the x-axis), or flush with the bottom of the STI trench. As will be appreciated in light of this disclosure, the depth of the fin recess will depend on factors such as the desired channel configuration and material, substrate thickness, and/or fin height. In some embodiments, the etching process may alter the width of recesses, with the top of the trench being wider than the bottom in some such cases. In another embodiment where the original sacrificial fin was wider at the bottom than the top, the top may be widened to be closer to or exceed the width at the bottom. In yet another embodiment, the recess may end up with a slightly hourglass shape, wider at the top and bottom than in the middle. In yet another embodiment, the width may be substantially unchanged by the etching process. In a more general sense, the shape of the recess/fin may be changed by the etching process (but not necessarily so), which may in turn may change the shape of the diffusion area (or portions thereof).

Figure 3:
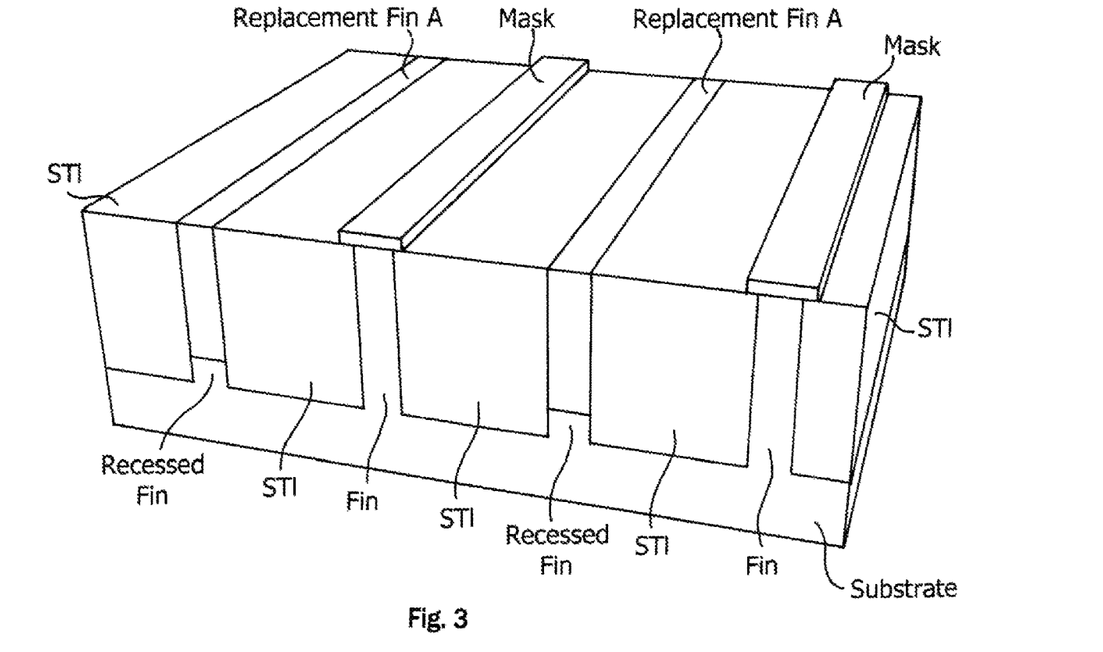

FIG. 3 illustrates a process that involves selectively growing or otherwise forming a replacement in each of the recessed fins, and then planarizing as necessary, in accordance with an embodiment of the present invention. As can be seen in this example case, the recessed fins have been filled with a particular semiconductor material, alloy or compound (e.g., column IV material, column III-V materials, etc). The epitaxial material can be configured as desired with respect to any number of parameters of interest, such as layer thickness, polarity, doping, composition and/or strain. The resulting replacement fins are generally designated replacement fins A in FIG. 3, and may also be referred to as type A fins. Note that, in some embodiments, the planarization process for the replacement fins A can also be used to remove the mask from the remaining sacrificial fins, to facilitate their subsequent processing. In one specific embodiment, the substrate is a bulk silicon substrate and the replacement fins are SiGe. Note that the epitaxial deposition may result in some excess material that extends from the surface and may be misshapen, faceted and irregular. Such excess material can be removed during planarization and the top surface deposition topology is not particularly relevant to the claimed invention.

Figure 4:
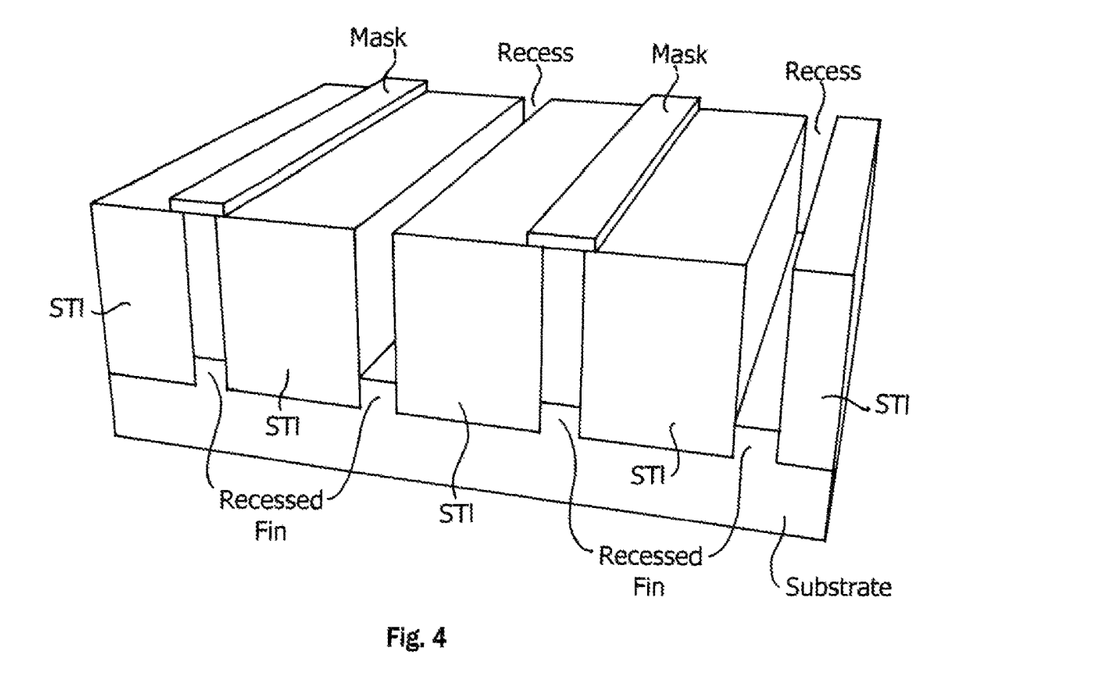

FIG. 4 illustrates a process and resulting structure wherein some of the finished fins (type A replacement fins) are masked, and the other remaining fins are recessed, in accordance with an embodiment of the present invention. The previous discussion with respect to masking and recessing fins with respect to FIG. 2 is equally applicable here. Any number of suitable masking and/or selective etch processes can be used, and the claimed invention is not intended to be limited to any particular process.

Figure 5:
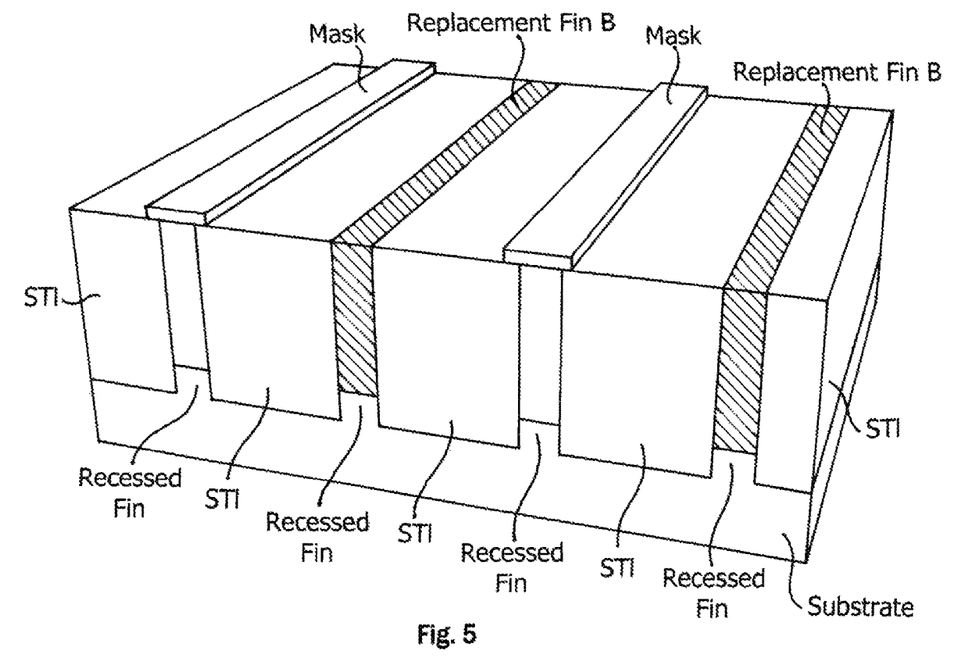

FIG. 5 illustrates a process that involves selectively growing or otherwise forming a replacement fin in each of the recessed fins formed in FIG. 4, and then planarizing as necessary, in accordance with an embodiment of the present invention. As can be seen in this example case, the recessed fins of this second set have been filled with a particular semiconductor material, alloy or compound (e.g., column IV material, column III-V materials, etc) that is different from the type A replacement fins. The resulting replacement fins of this process are generally designated replacement fins B in FIG. 5, and may also be referred to as type B replacement fins. Each of the replacement fins can be configured as desired with respect to any number of parameters of interest, such as layer thickness, composition, polarity, doping, and/or strain. Note that the type A replacement fins can be completely independent of the process for the type B replacement fins, and vice-versa. Thus, the polarity, strain, and/or composition of one replacement fin type of type may be different than that in another replacement fin type, in accordance with other embodiments.

Figure 6:
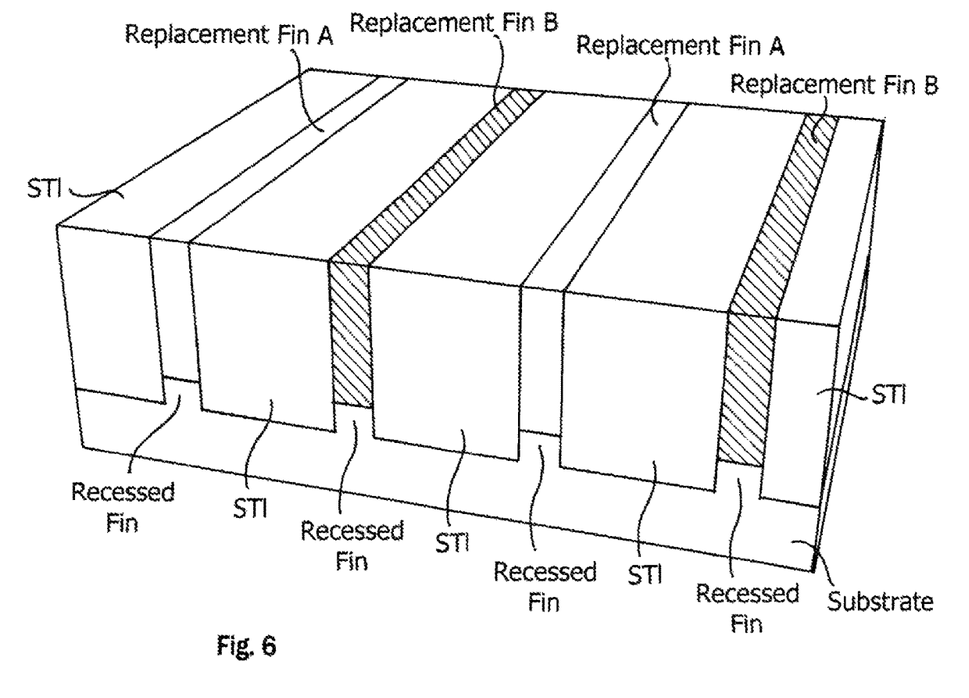

FIG. 6 illustrates the resulting structure after a process that removes the masking layer is carried out, and after any desired planarization, in accordance with an embodiment of the present invention. Note that the planarization can be local to where needed, and may use the top of the STI layer and/or the unmasked fins as an effective etch stop. As will be appreciated in light of this disclosure, the resulting structure configured with replacement fins of types A and B can be used for numerous applications. In a CMOS application, for instance, the type A replacement fins may be configured into NMOS transistors and the type B replacement fins may be configured into PMOS transistors. Alternatively, the type A replacement fins may be configured into a first type of NMOS transistors, and type B replacement fins may be configured into a second type of NMOS transistors. Alternatively, the type A replacement fins may be configured into a first type of PMOS transistors, and type B replacement fins may be configured into a second type of PMOS transistors. Moreover, note that other embodiments may have any number of diverse replacement fin configurations, and the claimed invention is not intended to limited to two types as shown. For instance, one embodiment may include four distinct replacement fin types A, B, C, and D, wherein the type A replacement fins are configured into a first type of NMOS transistors, the type B replacement fins are configured into a first type of PMOS transistors, the type C replacement fins are configured into a second type of NMOS transistors, and the type D replacement fins are configured into a second type of PMOS transistors. Another example embodiment may include, in addition to any provisioned replacement fins as described herein, one or more unrecessed fins so as to provide a mix of recess-and-replace based transistors and original fin based transistors in the same integrated circuit. In a more general sense, any arbitrary number of permutations of replacement fin types can be implemented with or without original fins, as will be appreciated in light of this disclosure.

FIG. 7 illustrates a process and resulting structure wherein the trench oxide (or other STI material) of the structure shown in FIG. 6 is recessed, in accordance with an embodiment of the present invention. This can be carried out, for example, by masking the finished replacement fins A and B and etching the STI to a suitable depth, or without a mask by using a selective etch scheme. Any suitable etch process (e.g., wet and/or dry) can be used. For instance, in one specific example embodiment, wherein the STI is implemented with silicon dioxide and each of the replacement fins A and B is implemented with SiGe, the STI recess process can be carried out using an etchant that is selective to the fin material (doesn't etch the fin material or otherwise etches the fin material slower than the STI material). As will be appreciated, a mask that is impervious or otherwise suitably resistant to the STI etchant can be patterned to protect the replacement fins A and B, if necessary. The depth of the STI recess can vary from one embodiment to the next, and in this example embodiment is flush with the top of the remaining sacrificial fin material (or pedestal). As will be further appreciated in light of this disclosure, the depth of the STI recess will depend on factors such as the desired diffusion geometry, STI thickness and desired isolation, and/or fin height. In various embodiments, this partial removal of STI may alter the width W (as shown in FIG. 1) of one or more of the replacement fins A and B, with the top of the replacement fins ending up relatively narrower than the bottom of the replacement fins in an embodiment. In other embodiments, the relative widths along the height of the replacement fins may remain relatively unchanged. In some embodiments, replacement fins A and B may comprise different materials, with a type A replacement fin having its width W changed more than the type B replacement fin width W is changed. Note that such width variations as described here and with respect to FIGS. 1 and 2 may be applicable to any of the etching processes described in this disclosure.

Figure 8:
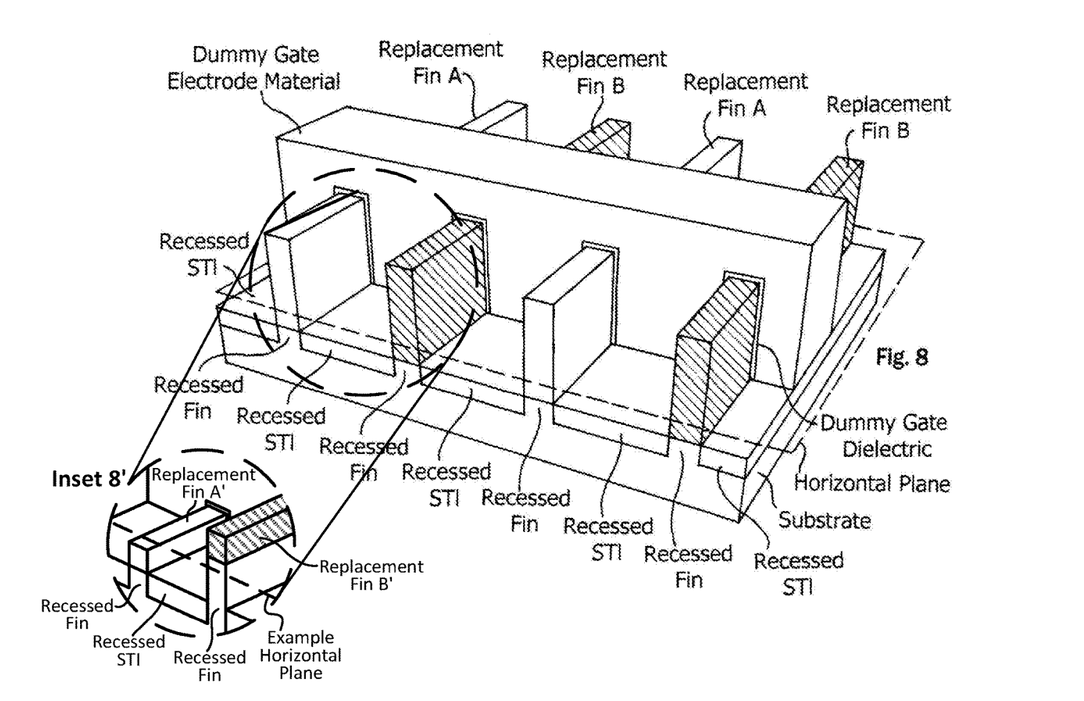

FIG. 8 illustrates a process and resulting structure wherein a dummy gate electrode material is deposited over the replacement fins A and B, and then patterned to form a plurality of sacrificial gates, in accordance with an embodiment of the present invention. As is further shown, a dummy gate dielectric may be provisioned prior to deposition of the dummy gate electrode material. This gate dielectric is referred to as a dummy gate dielectric in the sense that it can be removed and replaced in a subsequent process in some embodiments. Note, however, that in other embodiments a gate dielectric intended for the final structure can be used. Example dummy gate dielectric materials include, for instance, silicon dioxide, and example dummy gate electrode material includes polysilicon, although any suitable dummy/sacrificial gate dielectric and/or electrode materials can be used. As will be appreciated, the dimensions of the gate materials will vary from one embodiment to the next and can be configured as desired, depending on factors such as the desired device performance attributes, device size, and gate isolation.

Thus, in a CMOS application, both PMOS and NMOS transistor channels could be replaced with desired materials. For example, one embodiment may include SiGe in the p-channels and InAs in the n-channels. A wide variety of materials could be similarly proposed for the n-channel such as silicon carbide alloy, indium phosphide, gallium arsenide, etc, as well as the p-channel. Note that the order of p or n channel may depend, for example, on acceptable thermal budget considerations or other such factors. The claimed invention is not intended to be limited to any preference to p-type first vs n-type first. In any such cases, a mix and match of any semiconductor channel materials ranging from column IV semiconductor materials and alloys to compound semiconductors of any type can be used.

Subsequent processing to form a completed device, which may include for instance, source and drain regions, a final gate stack, and metal contacts, can be carried out for instance as conventionally done or using any custom processing as desired. Numerous configurations will be apparent in light of this disclosure, and the claimed invention is not intended to be limited to any particular one. In addition, some example source/drain forming techniques and structures, in accordance with various embodiments, are provided in turn with further reference to FIGS. 11a-f.

Figure 9A:
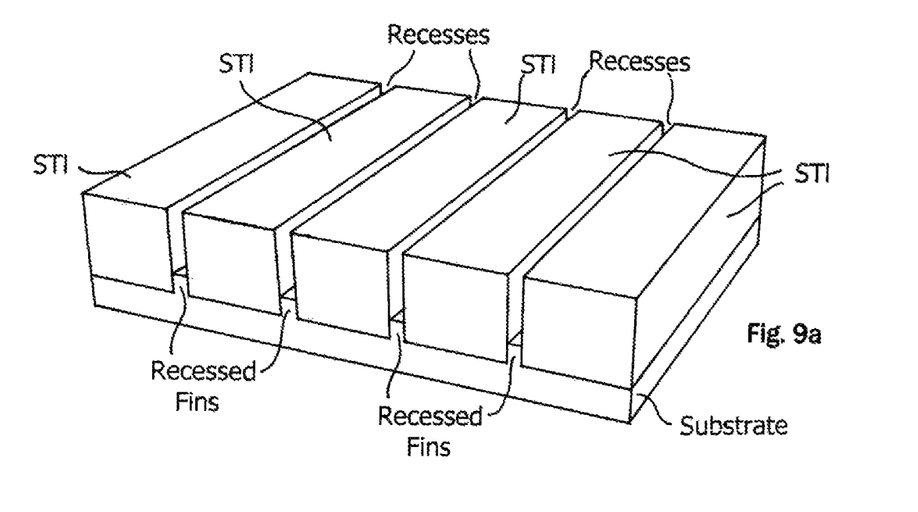
FIGS. 9a-9c illustrate a process for forming fin-based transistor devices, as well as various example resulting structures, in accordance with another embodiment of the present invention.
Figure 9B:
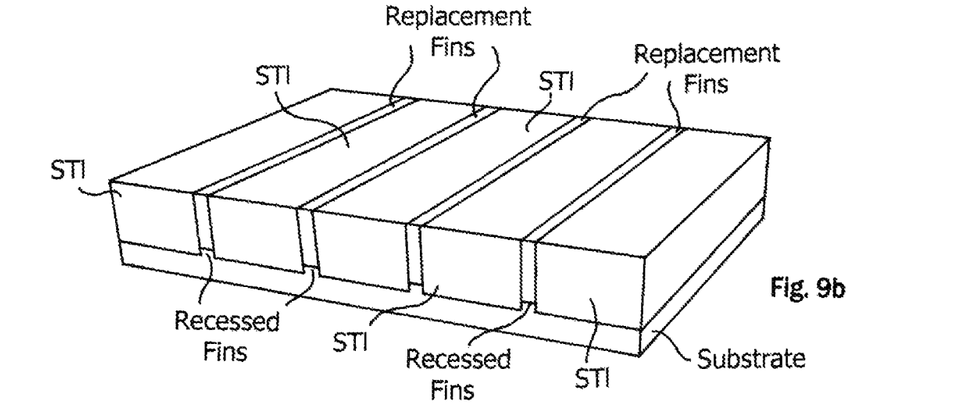
Figure 9C:
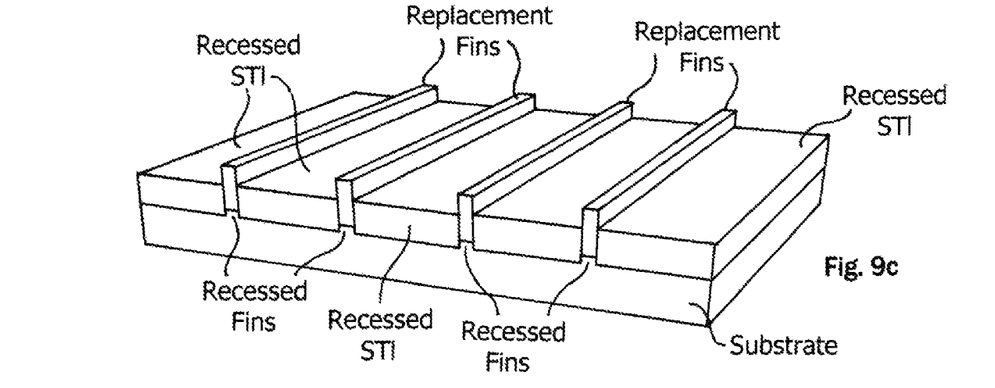

FIGS. 9a-9c illustrate a process for forming fin-based transistor devices, as well as various example resulting structures, in accordance with another embodiment of the present invention. This example process assumes that the replacement fin material (e.g., SiGe or other desired semiconductor material, alloy or compound) is suitable for both p-channel and n-channel, or whatever transistors are being configured. FIG. 9a is similar to the recess process discussed with reference to FIG. 2, except that here all of the original fins are recessed. Thus, no masking or selectivity is necessary (other than the masking of or selectivity to the STI). The recessing of the fins may be carried out, for example, simultaneously (all fins together), individually, or in sub-groups, and in no particular order. FIG. 9b is similar to the epitaxial deposition process discussed with reference to FIGS. 3 and 5. A common material can thus be deposited into each of the recessed fin area and then planarized. FIG. 9c is similar to the STI recess process discussed with reference to FIG. 7. In this example case, note that the STI is recessed not to be flush with the top of the etch fin, but rather to a mid-region of the replacement fins. Other embodiments may have a shallower or deeper recess trench isolation material, as suitable for a given application. The gate stack can then be provided as previously described with reference to FIG. 8. Other previous relevant discussion with respect to carrying out the recess and replacement methodology is equally applicable here.

Fin and Replacement Fin Hybrid

Figure 10A:
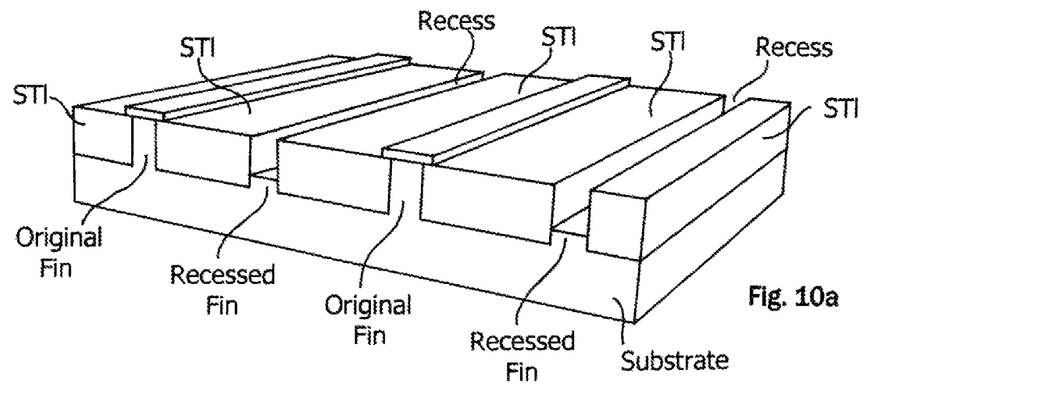
FIGS. 10a-10c illustrate a process for forming fin-based transistor devices, as well as various example resulting structures, in accordance with another embodiment of the present invention.
Figure 10B:
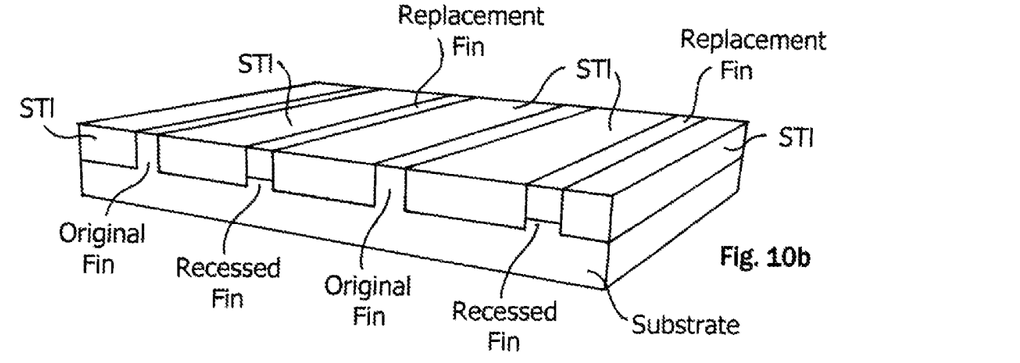
Figure 10C:
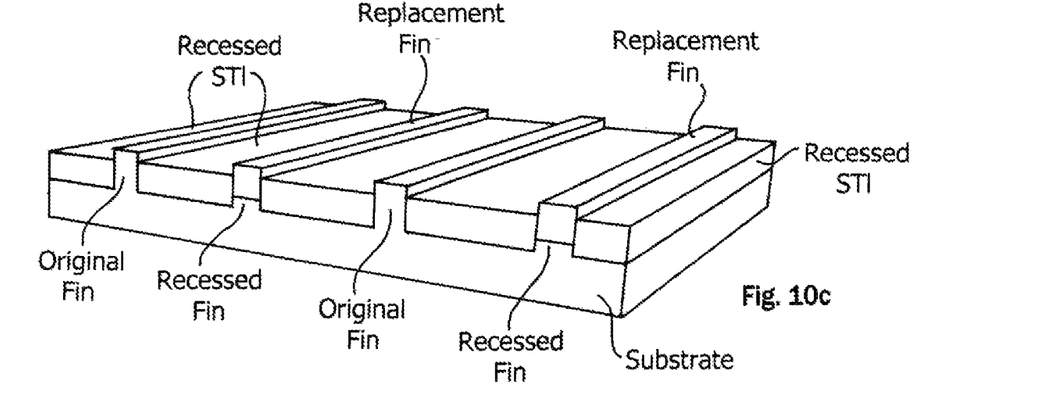

FIGS. 10a-10c illustrate a process for forming fin-based transistor devices, as well as various example resulting structures, in accordance with another embodiment of the present invention. FIG. 10a is similar to the recess process discussed with reference to FIG. 2, and FIG. 10b is similar to the epitaxial deposition process discussed with reference to FIGS. 3 and 5. A common material can thus be deposited into each of the recessed fin area and then planarized as previously described. Thus, a combination of original and replacement fins are provisioned. FIG. 10c is similar to the STI recess process discussed with reference to FIG. 7. In this example case, the STI is recessed to a mid-region of the replacement fins and the original fins. The gate stack can then be provided as previously described with reference to FIG. 8. Other previous relevant discussion with respect to carrying out the recess and replacement methodology is equally applicable here.

In one example embodiment, the original fins are silicon and the replacement fins are implemented with a p-MOS channel material such as a strained SiGe alloy having a germanium concentration in a range from 0.1% to 90%, or higher up to pure germanium. Note that if the SiGe alloy were deposited in the conventional way as a planar layer that was subsequently etched into fins, the highest germanium concentration of strained SiGe would be limited to 40% for thickness up to 100 nm. Moreover, conventional techniques do not allow for mixing of silicon fins and SiGe fins on the same wafer at the same height. Numerous fin/replacement fin materials and configurations will be apparent in light of this disclosure, and the claimed invention is not intended to be limited to any particular ones. Factors such as desired circuit performance, available materials, fab capability, and application specific details can be considered in customizing the fins as described herein. Such customization can be made with respect to, for example, n-type or p-type polarity, or any transistor performance factor such as frequency of operation, current density, power capability, gain, bandwidth, etc.

Diverse Channel Materials in Same Horizontal Plane

Numerous alternative embodiments and variations will be apparent in light of this disclosure. For example, in the embodiments shown, the channel regions of one replacement fin type are on the same horizontal plane as or otherwise overlap with the channel regions of another replacement fin type, such as is shown in FIG. 8, where an example common horizontal plane is provided in dashed lines. In another example embodiment, the channel regions of one replacement fin type may not be on the same horizontal plane as or otherwise overlap with the channel regions of another provisioned replacement fin type, such as is shown in the blown-out portion of Inset 8', where an example horizontal plane is provided by a dashed line to show that replacement fin A' does not share a common horizontal plane with replacement fin B'. In one specific example case, the channel regions of original fins can be silicon, the channel regions of replacement fin type C can be SiGe, the channel regions of replacement fin type B can be gallium arsenide and the channel regions of replacement fin type D can be indium arsenide. As used herein, being in the same horizontal plane implies that there is at least some overlap between a channel region of a first replacement fin type and a channel region of a second replacement fin type, such that at least one horizontal common plane cuts through both channel regions of each of the first and second replacement fin types. However, and as will be appreciated in light of this disclosure, note that such overlap is not necessary. In a more general sense, each replacement fin type can be implemented independently of other replacement fin types, and may be configured with or without a common plane of existence and/or material composition relative to other replacement fin types. A complete range of fin/replacement fin diversity to homogeneity is enabled by the techniques provided herein.

Gate and Source/Drain Formation

Following formation of the discrete channel regions such as in the variously example embodiments depicted in FIGS. 8, 9a-c and 10a-c, gate dielectric and gate electrode processing may be performed, and source and drain contacts may be added, in accordance with some example embodiments. Such post-channel processing can be carried out, for instance, as conventionally done. Other typical processing steps to facilitate the complete fabrication of a transistor-based integrated circuit will be apparent, such as intermediate planarization and cleaning processes, silicidation processes, contact and interconnect forming processes, and deposition-masking-etch processes. Moreover, some embodiments may employ a remove-and-replace process for forming the source/drain regions, if so desired (rather than using the as-is fin or replacement fin materials). Numerous subsequent processing schemes will be apparent in light of this disclosure.

In some example embodiments, the gate dielectric can be, for example, any suitable oxide such as $SiO_2$ or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used. In general, the thickness of the gate dielectric should be sufficient to electrically isolate the gate electrode from the source and drain contacts. The gate electrode material can be, for example, polysilicon, silicon nitride, silicon carbide, or a metal layer (e.g., tungsten, titanium nitride, tantalum, tantalum nitride) although other suitable gate electrode materials can be used as well. The formed gate electrode may then be covered with a mask to protect it during subsequent processing. The gate dielectric, gate electrode and any optional mask materials can be generally referred to as a gate stack or gate structure.

Once the gate stack is fabricated, the source/drain regions can be processed. This processing may include, for example, exposing the source/drain regions by etching or otherwise removing the additional insulator material from around the fin or replacement fins, so that source drain contacts can be provisioned, which may be accomplished using a silicide process, for example. Typical source drain contact materials include, for example, tungsten, titanium, silver, gold, aluminum, and alloys thereof.

Figure 11A:
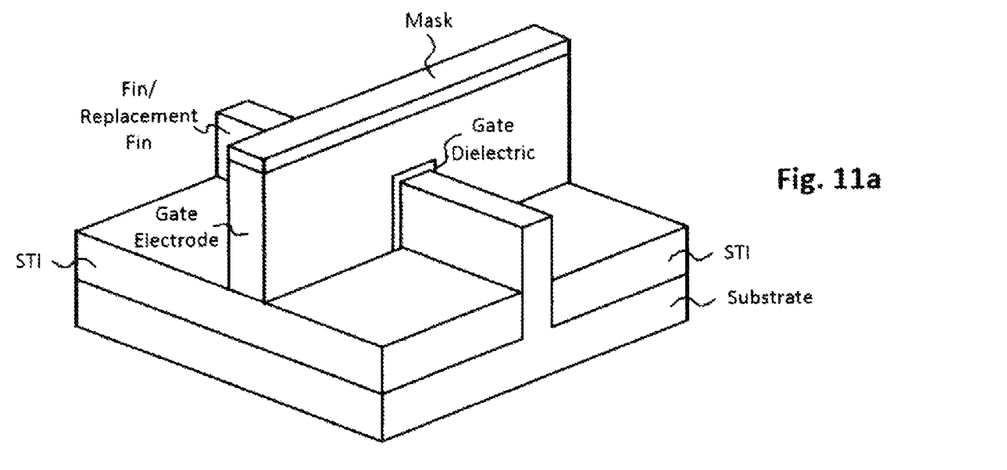
FIGS. 11a-11f illustrate a process for forming a bi-layer source/drain structure, in accordance with an example embodiment.
Figure 11B:
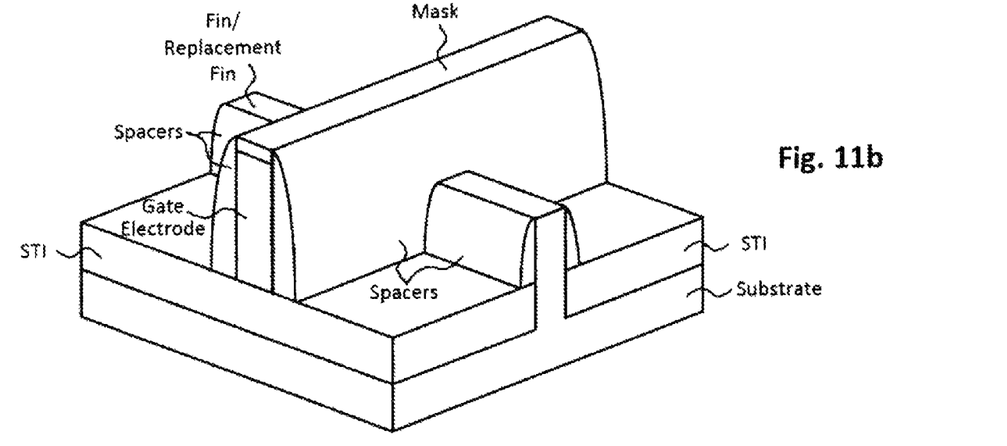
Figure 11C:
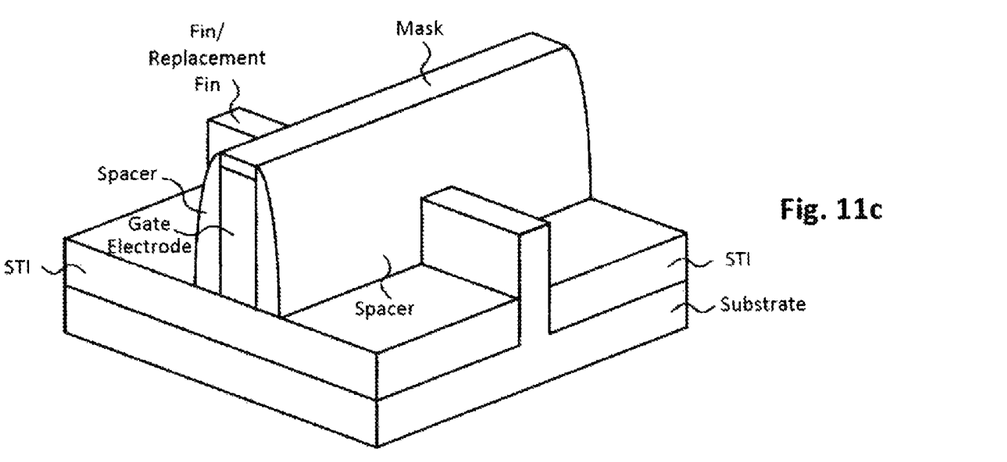
Figure 11D:
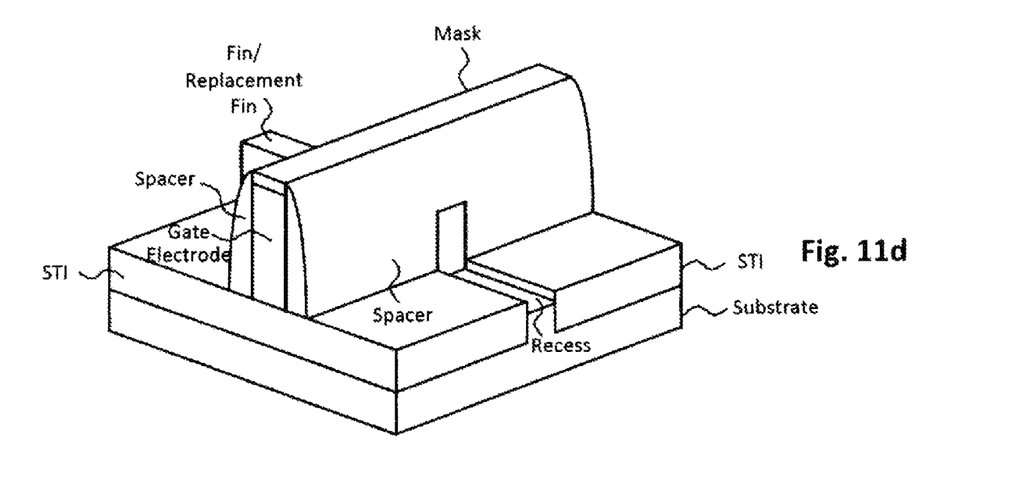
Figure 11E:
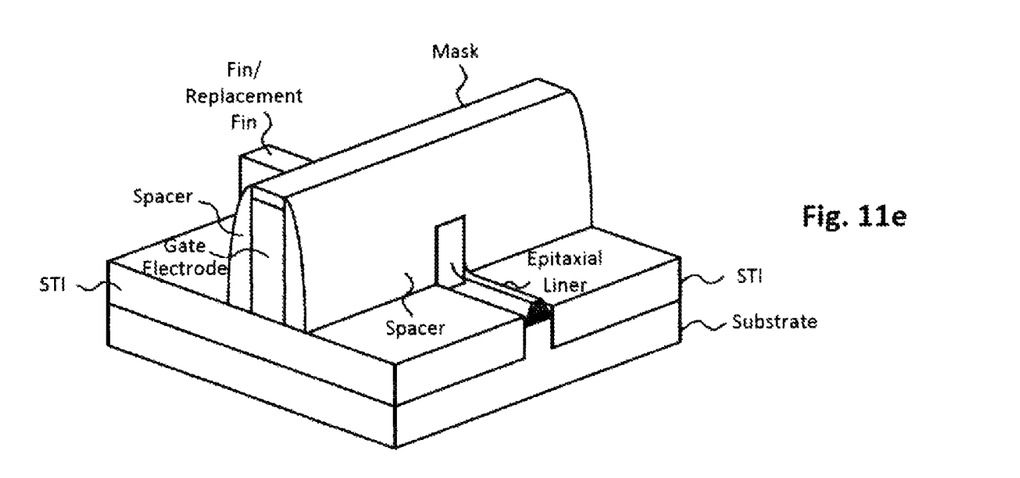
Figure 11F:
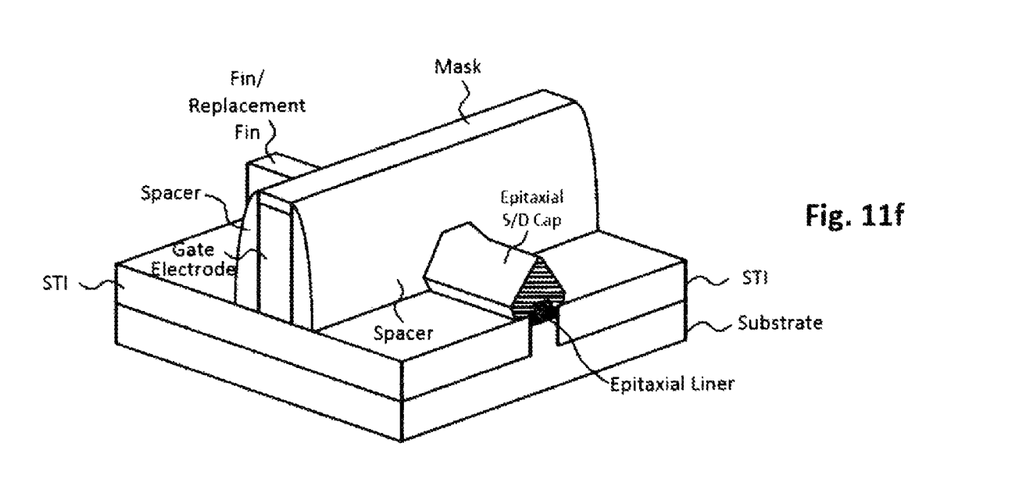

As previously explained, some embodiments may employ a remove-and-replace process for forming the source/drain regions, if so desired (rather than using the as-is fin or replacement fin). FIGS. 11a-11f illustrate one such example process to provide a transistor structure having a bi-layer source/drain structure, in accordance with an example embodiment. As will be appreciated, only one fin/replacement fin is shown for purposes of simplifying the discussion, but the same concepts can equally be applied to a structure having any number of fins/replacement fins and in any number of configurations as described herein. FIG. 11a shows a gate electrode formed over three surfaces of a fin to form three gates (i.e., a tri-gate device). A gate dielectric material is provided between the fin/replacement fin and the gate electrode, and a hardmask is formed on top of the gate electrode. FIG. 11b illustrates the resulting structure after deposition of insulating material and subsequent etch that leaves a coating of the insulator material on all vertical surfaces, so as to provide spacers on the sidewalls of the gate electrode and fin/replacement fin. FIG. 11c illustrates the resulting structure after an additional etch treatment to eliminate excess insulating/spacer material from sidewalls of the fin/replacement fin, thereby leaving only spacers opposite sidewalls of the gate electrode. FIG. 11d illustrates the resulting structure after a recess etch to remove the fin/replacement fin in the source/drain region of the substrate, thereby forming the recess such that the recessed fin/replacement fin has a top surface that is below the STI. Note that other embodiments may not be recessed (e.g., source/drain region is flush with the STI layer or above the STI layer). FIG. 11e illustrates the resulting structure after growth of an epitaxial liner, which in some embodiments may be thin, p-type and contain significant fraction of silicon (e.g., silicon or SiGe having 70 atomic % silicon), or be pure germanium (e.g., a separate layer of germanium, or a non-detectable layer that is integrated or otherwise included in the composition of the caps to be discussed in turn). FIG. 11f illustrates the resulting structure after growth of an epitaxial source/drain cap, which in some example embodiments can be p-type, and comprise primarily germanium but may contain less than 20 atomic % tin or other suitable alloying material, as previously explained. As will further be appreciated, note that an alternative to the tri-gate configuration is a double-gate architecture, which would include a dielectric/isolation layer on top of the fin/replacement fin. Further note that the example shapes of the liner and cap making up the source/drain regions shown in FIGS. 11e-f are not intended to limit the claimed invention to any particular source/drain types or formation processes, and other source/drain shapes will be apparent in light of this disclosure (e.g., round, square or rectangular source/drain regions may be implemented).

As will be appreciated, the depicted methodology can be carried out using any suitable standard semiconductor processes, including lithography, chemical vapor deposition (CVD), atomic layer deposition (ALD), spin-on deposition (SOD), physical vapor deposition (PVD), wet and dry etching (e.g., isotropic and/or anisotropic), depending on the materials used and desired profiles. Alternate deposition techniques may be used as well, for instance, various material layers may be thermally grown. As will be further appreciated in light of this disclosure, any number of suitable materials, layer geometries, and formation processes can be used to implement an embodiment of the present invention, so as to provide a custom fin-based device or structure as described herein.

Example System

Figure 12:
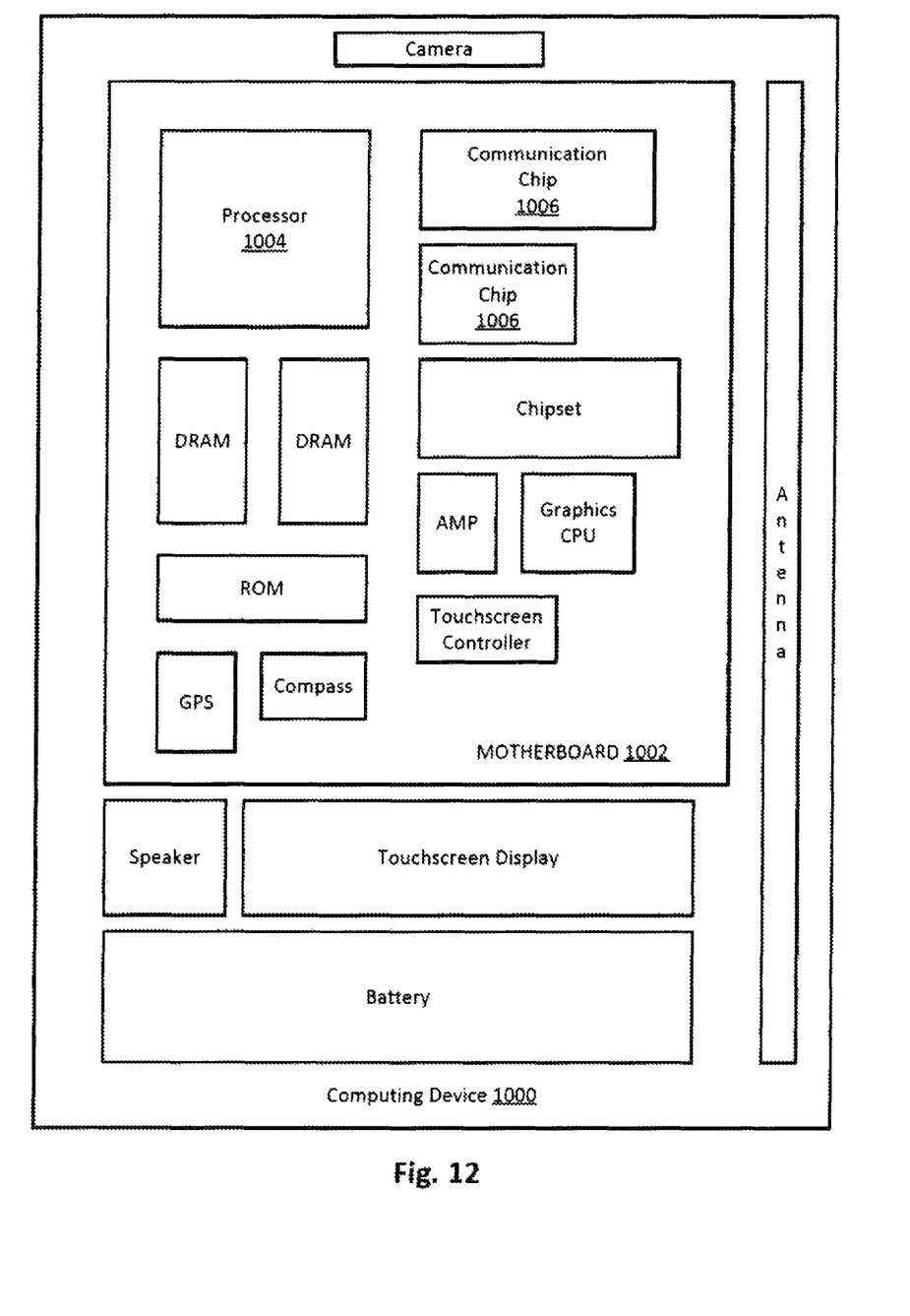
FIG. 12 illustrates a computing system implemented with one or more integrated circuit structures configured in accordance with an embodiment of the present invention.

FIG. 12 illustrates a computing system implemented with one or more integrated circuit structures configured in accordance with an embodiment of the present invention. As can be seen, the computing system 1000 houses a motherboard 1002. The motherboard 1002 may include a number of components, including but not limited to a processor 1004 and at least one communication chip 1006 (two are shown in this example), each of which can be physically and electrically coupled to the motherboard 1002, or otherwise integrated therein. As will be appreciated, the motherboard 1002 may be, for example, any printed circuit board, whether a main board or a daughterboard mounted on a main board or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures configured with fin-based transistors having customized channels. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments of the present invention, the integrated circuit die of the processor 1004 includes one or more fin-based transistors having customized channels as described herein. The term "processor" may refer to any device or portion of a device that processes, for instance, electronic data from registers and/or memory to transform that electronic data into other electronic data that may be stored in registers and/or memory.

The communication chip 1006 may also include an integrated circuit die packaged within the communication chip 1006. In accordance with some such example embodiments, the integrated circuit die of the communication chip 1006 includes one or more fin-based transistors having customized channels as described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the system 1000 may be any other electronic device that processes data or employs fin-based transistor devices as described herein (e.g., CMOS devices having both p and n type devices configured with customized channels on the same die). As will be appreciated in light of this disclosure, various embodiments of the present invention can be used to improve performance on products fabricated at any process node (e.g., in the micron range, or sub-micron and beyond) by allowing for the use of fin-based transistors having customized and diverse channel configurations (e.g., Si, SiGe, Si/SiGe, III-V, and/or combinations thereof) on the same die.

Numerous embodiments will be apparent, and features described herein can be combined in any number of configurations. One example embodiment of the present invention provides a method for forming a fin-based transistor structure. The method includes forming a plurality of fins on a substrate, each fin extending from the substrate. The method further includes forming a shallow trench isolation on opposing sides of each fin, and recessing at least some of the fins to provide a first set of recesses. The method further includes forming a substitute fin of a first type in each recess of the first set of recesses, each substitute fin of the first type comprising a channel of the transistor structure. In some cases, recessing at least some of the fins to provide a first set of recesses includes masking a first set of the fins of the plurality so as to leave a first set of unmasked sacrificial fins, and recessing the first set of unmasked sacrificial fins to provide the first set of recesses. In some case, the method includes planarizing each substitute fin of the first type, wherein said planarizing includes removing masking material over the first set of fins. In one such case, the method further includes masking each of the substitute fins of the first type so as to leave a second set of unmasked sacrificial fins, recessing the second set of unmasked sacrificial fins to provide a second set of recesses, and forming a substitute fin of a second type in each recess of the second set of recesses. In one such case, at least one horizontal common plane cuts through respective channels of at least one substitute fin of the first type and at least one substitute fin of the second type. In another such example case, there is no horizontal common plane that cuts through respective channels of the first and second type substitute fins. In another such case, the substitute fins of the first type are configured differently than the substitute fins of the second type with respect to at least one of polarity, strain, and/or composition. For instance, in one such case, the substitute fins of the first type are configured for one of PMOS or NMOS and the substitute fins of the second type are configured for the other of PMOS or NMOS. In another such case, the method further includes planarizing each substitute fin of the second type, wherein said planarizing includes removing masking material over the substitute fins of the first type. In some cases, recessing at least some of the fins to provide a first set of recesses comprises recessing all fins in the plurality. In some cases, the method includes recessing shallow trench isolation on the substrate to expose sidewalls of the substitute fins of the first type, forming a gate over the substitute fins of the first type, and forming source/drain regions associated with the gate. In some cases, remaining fins of the plurality of fins are not substitute fins and are of a second type, each remaining fin of the second type comprising a channel of the transistor structure. In one such case, the method further includes recessing shallow trench isolation on the substrate to expose sidewalls of the substitute fins of the first type and the remaining fins of the second type, forming a gate structure over the substitute fins of the first type and the remaining fins of the second type, and forming source/drain regions associated with the gate structure. Numerous variations will be apparent. For instance, another embodiment provides an integrated circuit formed by the method as variously defined in this paragraph.

Another embodiment of the present invention provides a transistor device. The device includes a first plurality of substitute fins of a first type on a substrate, each substitute fin of the first plurality extending from the substrate and comprising a channel area. The device further includes a second plurality of other fins on the substrate, each fin of the second plurality extending from the substrate and comprising a channel area. In some cases, the second plurality of other fins are also substitute fins of the first type. In some cases, the second plurality of other fins are of a second type, and the channel areas of the first type substitute fins are configured differently than the channel areas of the second type other fins with respect to at least one of polarity, strain, and/or composition. In one such case, the second type other fins are also substitute fins. In another such case, the second type other fins are not substitute fins. In some cases, the device includes a shallow trench isolation on opposing sides of each fin of the first and second plurality of fins. In some cases, at least one horizontal common plane cuts through respective channel areas of at least one first type substitute fin and at least one of the other fins. In other cases, there is no horizontal common plane that cuts through respective channel areas of both any one of the first type substitute fins and any one of the other fins. In some cases, the channel areas of the first type substitute fin are configured for one of PMOS or NMOS and the channel areas of the other fins are configured for the other of PMOS or NMOS. In some cases, the device further includes a gate stack and source/drain regions. Another embodiment provides an integrated circuit comprising the device as variously described in this paragraph. Another embodiment provides a system comprising the integrated circuit.

Another embodiment of the present invention provides a transistor device. In this example case, the device includes a first plurality of substitute fins of a first type on a substrate, each substitute fin of the first plurality extending from the substrate and comprising a channel area. The device further includes a second plurality of other fins on the substrate, each fin of the second plurality extending from the substrate and comprising a channel area. The device further includes a shallow trench isolation on opposing sides of each fin of the first and second plurality of fins. The device further includes a gate stack on multiple channel area surfaces of the first and second plurality of fins extending above the shallow trench isolation so as to provide multi-gates per fin, and source/drain regions corresponding to at least one of the gates. At least one horizontal common plane cuts through respective channel areas of at least one first type substitute fin and at least one of the other fins. In some example cases, the second plurality of other fins are of a second type, and the channel areas of the first type substitute fins are configured differently than the channel areas of the second type other fins with respect to at least one of polarity, strain, and/or composition. In some other example cases, the other fins are also substitute fins that are compositionally different from the first type substitute fins. In one specific such example case, the channel areas of the first type substitute fin are configured for one of PMOS or NMOS and the channel areas of the other fins are configured for the other of PMOS or NMOS.

The foregoing description of example embodiments of the invention has been presented for the purposes of illustration and description. It is not intended to be exhaustive or to limit the invention to the precise forms disclosed. Many modifications and variations are possible in light of this disclosure. For instance, while the techniques are discussed primarily in the context of forming transistors such as FETs, other devices can be made as well such as diodes, variable capacitors, dynamic resistors, etc. It is intended that the scope of the invention be limited not by this detailed description, but rather by the claims appended hereto.

What is claimed is:

1. An integrated circuit (IC) comprising:
    a first fin on a base, the first fin including strained semiconductor material throughout a volume of at least a lower portion of the first fin, the lower portion extending up from the base and having a maximum width of less than 30 nanometers and a height in the range of greater than 35 nanometers to 500 nanometers, and the strained semiconductor material includes a germanium concentration of greater than 40 atomic percent, wherein the first fin has a bottommost surface;
    a second fin including one or more of aluminum, gallium, or indium, the second fin also including one or more of nitrogen, phosphorus, arsenic, or antimony, wherein the second fin has a bottommost surface non-co-planar with the bottommost surface of the first fin;
    a first gate structure at least on top and side surfaces of a portion of the first fin, the portion of the first fin being laterally between portions of the gate structure;
    a second gate structure over the second fin;
    a first source region comprising a p-type impurity and a first drain region comprising a p-type impurity, wherein at least the portion of the first fin is laterally between the first source and drain regions; and
    a second source region comprising an n-type impurity and a second drain region comprising an n-type impurity, wherein the second fin is laterally between the second source and drain regions.

2. The IC of claim 1, wherein at least a portion of the second fin is laterally between portions of the second gate structure.

3. The IC of claim 1, wherein the first and second fins, the first and second gate structures, the first source and drain regions, and the second source and drain regions are part of a complementary metal oxide semiconductor (CMOS) circuit.

4. The IC of claim 1, wherein the strained semiconductor material also includes silicon.

5. The IC of claim 4, wherein the germanium concentration is at least 60 atomic percent.

6. The IC of claim 1, wherein the strained semiconductor material consists essentially of germanium, not counting for impurities.

7. The IC of claim 6, wherein the strained semiconductor material also includes one or both of n-type or p-type impurities.

8. The IC of claim 1, wherein the IC is included in a mobile computing system.

9. The IC of claim 1, wherein the germanium concentration is at least 60 atomic percent.

10. An integrated circuit (IC) including at least one transistor, the IC comprising:

a first replacement fin on a first material, the first material compositionally distinct from the first replacement fin, the first replacement fin including strained semiconductor material throughout a volume of the first replacement fin, the first replacement fin having a maximum width of less than 30 nanometers and a height in the range of greater than 35 nanometers to 500 nanometers, and the strained semiconductor material includes a germanium concentration of greater than 40 atomic percent, wherein the first replacement fin has a bottommost surface;

a gate structure at least over and on sides of an upper portion of the first replacement fin, such that the upper portion of the first replacement fin is laterally between portions of the gate structure;

a source region and a drain region, the first replacement fin laterally between the source and drain regions; and a second replacement fin on the first material, the first material compositionally distinct from the second replacement fin, the second replacement fin comprising a Group III-V material, and the second replacement fin having a bottommost surface non-co-planar with the bottommost surface of the first replacement fin.

11. The IC of claim 10, wherein the strained semiconductor material includes a germanium concentration of at least 80 atomic percent.

12. The IC of claim 10, wherein the strained semiconductor material also includes silicon.

13. The IC of claim 10, wherein the strained semiconductor material also includes tin.

14. The IC of claim 10, wherein the gate structure includes a high-k dielectric material and a gate electrode, the high-k dielectric material between the gate electrode and the upper portion of the first replacement fin.

15. The IC of claim 10, wherein the gate structure includes a gate electrode and a gate dielectric, the gate dielectric between the gate electrode and the upper portion of the first replacement fin.

16. The IC of claim 10, wherein the source and drain regions each include semiconductor material and p-type impurities.

17. A transistor comprising:

a base of a first semiconductor material;

a first fin on the base, the first fin of a second semiconductor material compositionally distinct from the first semiconductor material, the second semiconductor material strained throughout all of the first fin, a mid-region of the first fin between a top and a bottom of the first fin having a maximum width of less than 30 nanometers, a height in the range of greater than 35 nanometers to 500 n nanometers, and a germanium concentration of greater than 40 atomic percent, wherein the first fin has a bottommost surface;

a gate electrode at least on top and side walls of an upper portion of the first fin, the upper portion of the first fin also laterally between portions of the gate electrode;

a gate dielectric between the gate electrode and the first fin;

a source region and a drain region, the first fin laterally between the source and drain regions; and a second fin on the base, the first semiconductor material compositionally distinct from the second fin, the second fin comprising a Group III-V material, and the second fin having a bottommost surface non-co-planar with the bottommost surface of the first fin.

18. The transistor of claim 17, wherein the second semiconductor material also includes silicon, such that the second semiconductor material includes strained silicon germanium (SiGe).

19. The IC of claim 17, wherein the germanium concentration is at least 60 atomic percent.

* * * * *